(12) United States Patent
Sun et al.

(10) Patent No.: US 12,444,727 B2
(45) Date of Patent: Oct. 14, 2025

(54) SEMICONDUCTOR PACKAGE STRUCTURE AND MANUFACTURING METHOD

(71) Applicant: CHANGXIN MEMORY TECHNOLOGIES, INC., Anhui (CN)

(72) Inventors: Xiaofei Sun, Hefei (CN); Changhao Quan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 436 days.

(21) Appl. No.: 18/152,188

(22) Filed: Jan. 10, 2023

(65) Prior Publication Data

US 2024/0014196 A1 Jan. 11, 2024

Related U.S. Application Data

(63) Continuation of application No. PCT/CN2022/110253, filed on Aug. 4, 2022.

(30) Foreign Application Priority Data

Jul. 8, 2022 (CN) .......................... 202210853472.6

(51) Int. Cl.
*H01L 25/18* (2023.01)
*H01L 23/00* (2006.01)
(Continued)

(52) U.S. Cl.
CPC .............. *H01L 25/18* (2013.01); *H01L 23/36* (2013.01); *H01L 23/42* (2013.01);
(Continued)

(58) Field of Classification Search
CPC ..... H01L 25/18; H01L 25/0652; H01L 23/36; H01L 23/42; H01L 23/5383;
(Continued)

(56) References Cited

U.S. PATENT DOCUMENTS

| 7,026,709 B2 | 4/2006 | Tsai et al. |
| 7,354,800 B2 | 4/2008 | Carson |

(Continued)

FOREIGN PATENT DOCUMENTS

| CN | 1731917 A | 2/2006 |
| CN | 101075596 A | 11/2007 |

(Continued)

OTHER PUBLICATIONS

Korean Intellectual Property Office, Office Action Issued in Application No. 10-2022-7041847, Mar. 29, 2024, 16 pages.

(Continued)

*Primary Examiner* — Peniel M Gumedzoe
(74) *Attorney, Agent, or Firm* — Kilpatrick Townsend & Stockton LLP

(57) ABSTRACT

A semiconductor package structure is provided. The semiconductor package structure includes: a first package structure, including an intermediary layer and a molding compound, where a plurality of first connection pads are disposed on the intermediary layer, and the molding compound wraps the intermediary layer and is coplanar to the plurality of first connection pads; and a second package structure, disposed on the intermediary layer and electrically connected to the plurality of first connection pads. A gap is formed between the first package structure and the second package structure.

20 Claims, 13 Drawing Sheets

(51) Int. Cl.
    *H01L 23/36*         (2006.01)
    *H01L 23/42*         (2006.01)
    *H01L 23/538*       (2006.01)
    *H01L 25/065*       (2023.01)

(52) U.S. Cl.
    CPC ...... *H01L 23/5383* (2013.01); *H01L 23/5384* (2013.01); *H01L 24/32* (2013.01); *H01L 24/48* (2013.01); *H01L 24/73* (2013.01); *H01L 25/0652* (2013.01); *H01L 2224/32225* (2013.01); *H01L 2224/48227* (2013.01); *H01L 2224/73265* (2013.01); *H01L 2225/0651* (2013.01)

(58) Field of Classification Search
    CPC ..... H01L 23/5384; H01L 24/32; H01L 24/48; H01L 24/73; H01L 2224/32225; H01L 2224/48227; H01L 2224/73265; H01L 2225/0651
    See application file for complete search history.

(56) References Cited

U.S. PATENT DOCUMENTS

| | | |
|---|---|---|
| 7,800,211 B2 | 9/2010 | Yang et al. |
| 7,927,917 B2 | 4/2011 | Pagalla et al. |
| 8,227,925 B2 | 7/2012 | Song et al. |
| 9,595,509 B1 | 3/2017 | Yap |
| 10,410,968 B2 | 9/2019 | Park |
| 11,211,334 B2 | 12/2021 | Lin et al. |
| 2003/0219969 A1 | 11/2003 | Saito et al. |
| 2004/0145039 A1 | 7/2004 | Shim et al. |
| 2005/0023657 A1 | 2/2005 | Tsai et al. |
| 2008/0227238 A1 | 9/2008 | Ko et al. |
| 2009/0001540 A1 | 1/2009 | Yang et al. |
| 2009/0079091 A1 | 3/2009 | Song et al. |
| 2009/0085225 A1 | 4/2009 | Park |
| 2009/0091015 A1 | 4/2009 | Shen et al. |
| 2009/0236718 A1 | 9/2009 | Yang |
| 2009/0243068 A1 | 10/2009 | Kuan et al. |
| 2010/0046183 A1 | 2/2010 | Park |
| 2010/0072593 A1* | 3/2010 | Kim ........................ H01L 24/73 257/676 |
| 2010/0148354 A1 | 6/2010 | Choi |
| 2010/0244221 A1* | 9/2010 | Ko ........................ H01L 25/105 257/688 |
| 2010/0258930 A1 | 10/2010 | Oh |
| 2010/0301466 A1 | 12/2010 | Taoka et al. |
| 2010/0320582 A1 | 12/2010 | Pagaila et al. |
| 2011/0062591 A1 | 3/2011 | Choi |
| 2011/0127662 A1 | 6/2011 | Yang |
| 2011/0193205 A1 | 8/2011 | Hsieh |
| 2012/0146243 A1 | 6/2012 | Song et al. |
| 2012/0217645 A1* | 8/2012 | Pagaila ............... H01L 21/6835 438/109 |
| 2012/0319267 A1 | 12/2012 | Moon et al. |
| 2013/0075889 A1 | 3/2013 | Pagaila et al. |
| 2014/0103527 A1 | 4/2014 | Marimuthu et al. |
| 2014/0291821 A1 | 10/2014 | Song |
| 2015/0102506 A1 | 4/2015 | Song et al. |
| 2015/0115466 A1 | 4/2015 | Kim |
| 2016/0172337 A1 | 6/2016 | Kim |
| 2016/0343691 A1 | 11/2016 | Chen et al. |
| 2017/0069607 A1 | 3/2017 | Yap |
| 2017/0141043 A1 | 5/2017 | Park |
| 2017/0228529 A1 | 8/2017 | Huang et al. |
| 2018/0005974 A1 | 1/2018 | Chiu et al. |
| 2019/0013299 A1 | 1/2019 | Lee |
| 2019/0252772 A1 | 8/2019 | Ndip et al. |
| 2019/0296002 A1 | 9/2019 | Pei et al. |
| 2019/0378826 A1 | 12/2019 | Kim |
| 2020/0020637 A1 | 1/2020 | Kim et al. |
| 2020/0066663 A1 | 2/2020 | Aleksov et al. |
| 2020/0194331 A1 | 6/2020 | Kim et al. |
| 2020/0312783 A1 | 10/2020 | Min et al. |
| 2020/0381406 A1 | 12/2020 | Dominguez et al. |
| 2021/0035895 A1 | 2/2021 | Oh et al. |
| 2021/0035913 A1 | 2/2021 | Park et al. |
| 2021/0050294 A1 | 2/2021 | Tsai et al. |
| 2021/0343617 A1 | 11/2021 | Kim et al. |
| 2021/0351172 A1 | 11/2021 | Pei et al. |
| 2022/0122896 A1* | 4/2022 | Wang ................... H01L 25/105 |
| 2022/0130764 A1 | 4/2022 | Lin et al. |
| 2022/0199593 A1 | 6/2022 | Yang et al. |

FOREIGN PATENT DOCUMENTS

| | | |
|---|---|---|
| CN | 103219296 A | 7/2013 |
| CN | 204102862 U | 1/2015 |
| CN | 104576557 A | 4/2015 |
| CN | 105161435 A | 12/2015 |
| CN | 103219296 B | 4/2016 |
| CN | 107527877 A | 12/2017 |
| CN | 104576557 B | 8/2018 |
| CN | 110581121 A | 12/2019 |
| CN | 110718528 A | 1/2020 |
| CN | 110797325 A | 2/2020 |
| CN | 111819689 A | 10/2020 |
| CN | 113113318 A | 7/2021 |
| CN | 114664761 A | 6/2022 |
| JP | 60160645 A | 8/1985 |
| JP | 2002217331 A | 8/2002 |
| JP | 2004172157 A | 6/2004 |
| JP | 2005026680 A | 1/2005 |
| JP | 2010212605 A | 9/2010 |
| JP | 2011233672 A | 11/2011 |
| KR | 1020090091487 A | 8/2009 |
| KR | 20170094483 A | 8/2017 |
| KR | 20180004658 A | 1/2018 |
| KR | 20190093194 A | 8/2019 |
| KR | 20210016216 A | 2/2021 |
| TW | 200950132 A | 12/2009 |
| TW | 201314812 A | 4/2013 |
| TW | 201415586 A | 4/2014 |
| TW | 201532234 A | 8/2015 |
| TW | 202044520 A | 12/2020 |
| TW | 202101685 A | 1/2021 |
| TW | M627599 U | 6/2022 |

OTHER PUBLICATIONS

Korean Intellectual Property Office, Office Action Issued in Application No. 10-2022-7040844, Mar. 29, 2024, 16 pages.
Japanese Patent Office, Office Action Issued in Application No. 2022-562492, Sep. 3, 2024, 2 pages.
Japanese Patent Office, Office Action Issued in Application No. 2022-563494, Oct. 1, 2024, 9 pages.
Japanese Patent Office, Office Action Issued in Application No. 2022-566266, Oct. 8, 2024, 10 pages.
Japanese Patent Office, Office Action Issued in Application No. 2022-562587, Oct. 15, 2024, 8 pages.
First Office Action of the Taiwanese application No. 111139380, issued on May 29, 2023. 11 pages with English abstract.
International Search Report in the international application No. PCT/CN2022/110253, mailed on Dec. 21, 2022. pages.
Decision of Refusal issued in Japanese corresponding application No. 2022-562492 mailed on Apr. 22, 2025, 8 pages.
Non-final Office Action issued in corresponding U.S. Appl. No. 17/951,722 mailed on Jun. 11, 2025, 13 pages.
Search Report issued in Singaporean corresponding application No. 11202254069A mailed on May 23, 2025, 2 pages.
Written Opinion issued in Singaporean corresponding application No. 11202254069A mailed on Jun. 26, 2025, 7 pages.

* cited by examiner

SEMICONDUCTOR PACKAGE STRUCTURE AND MANUFACTURING METHOD

CROSS-REFERENCE TO RELATED APPLICATIONS

The disclosure is a continuation application of International Patent Application No. PCT/CN2022/110253, filed on Aug. 4, 2022, which is based upon and claims priority to Chinese Patent Application No. 202210853472.6, filed on Jul. 8, 2022 and entitled "SEMICONDUCTOR PACKAGE STRUCTURE AND MANUFACTURING METHOD". The disclosures of International Patent Application No. PCT/CN2022/110253 and Chinese Patent Application No. 202210853472.6 are hereby incorporated by reference in their entireties.

BACKGROUND

All sectors, industries and regions continually require lighter, faster, smaller, more functional, more reliable and more cost-effective products for the electronics industry. In order to meet these growing requirements of many different consumers, more circuits are required to be integrated to provide required functions. In almost all applications, there is a growing requirement for reducing dimensions, enhancing performance and improving the functions of the integrated circuits.

SUMMARY

The disclosure relates to the technical field of semiconductors, and in particular, to a semiconductor package structure and a manufacturing method.

In view of this, embodiments of the disclosure provide a semiconductor package structure and a manufacturing method.

A first aspect of an embodiment of the disclosure provides a semiconductor package structure, including:
  a first package structure, including an intermediary layer and a molding compound, where a plurality of first connection pads are disposed on the intermediary layer, and the molding compound wraps the intermediary layer and is coplanar to the plurality of first connection pads; and
  a second package structure, disposed on the intermediary layer and electrically connected to the plurality of first connection pads.

A gap is formed between the first package structure and the second package structure.

A second aspect of an embodiment of the disclosure provides a method for manufacturing a semiconductor package structure, including the following operations.

A first package structure is provided. The first package structure includes an intermediary layer and a molding compound. A plurality of first connection pads are disposed on the intermediary layer. The molding compound wraps the intermediary layer and is coplanar to the plurality of first connection pads.

A second package structure is provided. The second package structure is disposed on the intermediary layer and electrically connected to the plurality of first connection pads.

A gap is formed between the first package structure and the second package structure.

BRIEF DESCRIPTION OF THE DRAWINGS

In order to more clearly illustrate the technical solutions in the embodiments of the disclosure or conventional technologies, the drawings used in the technical description of the embodiments will be briefly described below. It is apparent that the drawings in the following descriptions are merely some embodiments of the disclosure. Other drawings can be obtained from those skilled in the art according to these drawings without any creative work.

LIST OF REFERENCE NUMERALS

Figure 1:
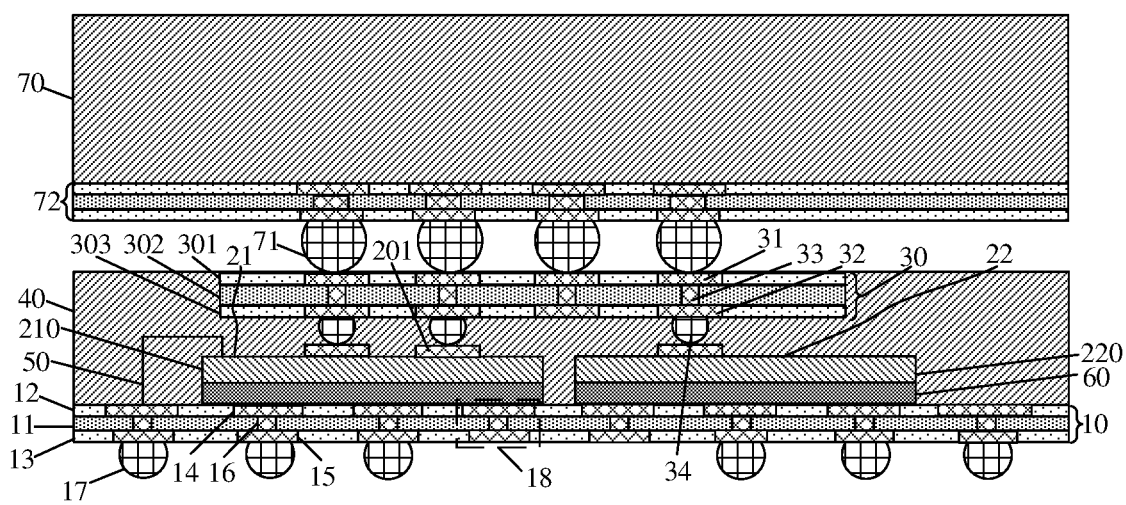
FIG. 1 is a schematic diagram of a semiconductor package structure according to an embodiment of the disclosure.

1—Circular ring; 2—Carrier band;
10—Base plate; 11—Base plate substrate; 12—Base plate upper insulating dielectric layer; 13—Base plate lower insulating dielectric layer; 14—Base plate upper connection pad; 15—Base plate lower connection pad; 16—Base plate connection via; 17—Base plate connection bump; 18—Virtual channel;
21—First chip stack body; 22—Second chip stack body; 210—First chip; 220—Second chip; 211—First upper chip; 212—First lower chip; 221—Second upper chip; 222—Second lower chip; 201—Lead wire pad; 202—Chip connection pad; 203—Chip connection solder ball;
30—Intermediary layer; 31—First connection pad; 32—Second connection pad; 33—Signal channel; 34—First solder ball; 301—Intermediary upper insulating dielectric layer; 302—Intermediary substrate; 303—Intermediary lower insulating dielectric layer;
40—Molding compound; 401—First filler;
50—Lead wire;
60—Bonding layer; 61—First bonding layer; 62—Second bonding layer;
70—Second package structure; 71—Second solder ball; 72—Second base plate;
80—Filling layer; 801—Second filler.

DETAILED DESCRIPTION

Exemplary embodiments disclosed in the disclosure are described in more detail with reference to drawings. Although the exemplary embodiments of the disclosure are shown in the drawings, it should be understood that the disclosure may be implemented in various forms and should not be limited by the specific embodiments described here. On the contrary, these embodiments are provided for more thorough understanding of the disclosure, and to fully convey a scope disclosed in the embodiments of the disclosure to a person skilled in the art.

In the following descriptions, a lot of specific details are given in order to provide the more thorough understanding of the disclosure. However, it is apparent to a person skilled in the art that the disclosure may be implemented without one or more of these details. In other examples, in order to avoid confusion with the disclosure, some technical features well-known in the field are not described. Namely, all the features of the actual embodiments are not described here, and well-known functions and structures are not described in detail.

In the drawings, the dimensions of a layer, a region, and an element and their relative dimensions may be exaggerated for clarity. The same reference numeral represents the same element throughout the description.

It should be understood that while the element or the layer is referred to as being "on", "adjacent to", "connected to" or "coupled to" other elements or layers, it may be directly on the other elements or layers, adjacent to, connected or coupled to the other elements or layers, or an intermediate element or layer may be existent. In contrast, while the element is referred to as being "directly on", "directly adjacent to", "directly connected to" or "directly coupled to" other elements or layers, the intermediate element or layer is not existent. It should be understood that although terms first, second, third and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the disclosure, a first element, component, region, layer or section discussed below may be represented as a second element, component, region, layer or section. While the second element, component, region, layer or section is discussed, it does not mean that the first element, component, region, layer or section is necessarily existent in the disclosure.

Spatial relationship terms, such as "under", "below", "lower", "underneath", "above", "upper" and the like, may be used here for conveniently describing so that a relationship between one element or feature shown in the drawings and other elements or features is described. It should be understood that in addition to orientations shown in the drawings, the spatial relationship terms are intended to further include the different orientations of a device in use and operation. For example, if the device in the drawings is turned over, then the elements or the features described as "below" or "underneath" or "under" other elements may be oriented "on" the other elements or features. Therefore, the exemplary terms "below" and "under" may include two orientations of up and down. The device may be otherwise oriented (rotated by 90 degrees or other orientations) and the spatial descriptions used here are interpreted accordingly.

A purpose of the terms used here is only to describe the specific embodiments and not as limitation to the disclosure. While used here, singular forms of "a", "an" and "said/the" are also intended to include plural forms, unless the context clearly indicates otherwise. It should also be understood that terms "composition" and/or "including", while used in the description, determine the existence of the described features, integers, steps, operations, elements and/or components, but do not exclude the existence or addition of one or more other features, integers, steps, operations, elements, components, and/or groups. As used herein, a term "and/or" includes any and all combinations of related items listed.

In order to understand the disclosure thoroughly, detailed operations and detailed structures are presented in the following description, so as to explain the technical solutions of the disclosure. Preferred embodiments of the disclosure are described in detail below. However, the disclosure may also have other implementations in addition to these detailed descriptions.

An embodiment of the disclosure provides a semiconductor package structure. FIG. 1 is a schematic diagram of a semiconductor package structure according to an embodiment of the disclosure.

With reference to FIG. 1, the semiconductor package structure includes a first package structure and a second package structure.

The first package structure includes an intermediary layer 30 and a molding compound 40. A plurality of first connection pads 31 are disposed on the intermediary layer 30. The molding compound 40 wraps the intermediary layer 30 and is coplanar to the plurality of first connection pads 31.

The second package structure 70 is disposed on the intermediary layer 30 and electrically connected to the plurality of first connection pads 31.

A gap is formed between the first package structure and the second package structure 70.

In the embodiments of the disclosure, through the arrangement of the intermediary layer, the first package structure can be connected to the second package structure by means of the intermediary layer. In this way, the interconnection among package structures with different capacities can be achieved, so as to cause a combination among different package structures to be more flexible. Therefore, the semiconductor package structure is applicable to different application scenarios. In addition, since the first package structure and the second package structure are independently packaged, the first package structure and the second package structure may be respectively tested, so that failure analysis can be performed more rapidly. Therefore, after the semiconductor package structure is assembled, testing may not be required to be performed on the entire structure. Since there is a gap between the second package structure and the first package structure, the spacing between the second package structure and the first package structure can be increased. Therefore, the heat dissipation efficiency of the second package structure can be enhanced, and the impact of heat on a chip (the first package structure) can be reduced. The second package structure is detachably disposed on the first package structure, so that the utilization rate of the first package structure can be enhanced by disposing the second package structure with different capacity on the first package structure.

In an embodiment, the first package structure further includes: a base plate 10; at least one first chip stack body 21, disposed on the base plate 10; and at least one second chip stack body 22, disposed on the base plate 10 and spaced apart from the at least one first chip stack body 21. The intermediary layer 30 is disposed on the first chip stack body 21 and the second chip stack body 22.

In this embodiment of the disclosure, the first chip stack body and the second chip stack body are connected with each other by means of the intermediary layer, so that the number of wire bonding can be decreased, and a wire bonding process can be simplified.

In some embodiments, the base plate 10 may be a redistribution base plate.

The base plate 10 includes a base plate substrate 11, a base plate upper insulating dielectric layer 12 disposed on an upper surface of the base plate substrate 11, and a base plate lower insulating dielectric layer 13 disposed on a lower surface of the base plate substrate 11.

The base plate substrate 11 may be a silicon substrate, a germanium substrate, a silicon germanium substrate, a silicon carbide substrate, an Silicon On Insulator (SOI) substrate, or a Germanium On Insulator (GOI) substrate, or may be a substrate including other element semiconductors or compound semiconductors, such as a glass substrate or a III-V compound substrates (for example, a gallium nitride substrate or a gallium arsenide substrate), or may be a stack of layer structures such as Si/SiGe, or may be other epitaxial structures such as Silicon Germanium On Insulator (SGOI).

Each of the base plate upper insulating dielectric layer 12 and the base plate lower insulating dielectric layer 13 may be a solder mask layer. For example, each of the material of the base plate upper insulating dielectric layer 12 and the material of the base plate lower insulating dielectric layer 13 may be green paint.

The base plate 10 further includes a base plate upper connection pad 14 located in the base plate upper insulating dielectric layer 12, a base plate lower connection pad 15 located in the base plate lower insulating dielectric layer 13, and a base plate connection via 16 which penetrates through the base plate substrate 11 and which connects the base plate upper connection pad 14 and the base plate lower connection pad 15 with each other.

Each of the material of the base plate upper connection pad 14 and the material of the base plate lower connection pad 15 may include at least one of aluminum, copper, nickel, tungsten, platinum, or gold. The base plate connection via 16 may be a Through-Silicon-Via (TSV).

The base plate upper connection pad 14 is connected to the base plate lower connection pad 15 by means of the base plate connection via 16, so that a signal can be transmitted. In addition, two adjacent base plate upper connection pads 14 may also be connected with each other by means of a re-distribution layer, so that the transmission of the signal on the base plate can be completed.

The base plate 10 further includes a base plate connection bump 17. The base plate connection bump 17 may electrically connect the semiconductor package structure to an external apparatus, so that at least one of a control signal, a power signal or a grounding signal that is configured to operate the chip stack body may be received from the external apparatus, or a data signal to be stored in the chip stack body may be received from the external apparatus, or data in the chip stack body may also be provided to the external apparatus.

The base plate connection bump 17 includes a conductive material. In the embodiment of the disclosure, the base plate connection bump 17 is a solder ball. It is to be understood that a shape of the base plate connection bump provided in this embodiment of the disclosure is only an inferior and feasible specific implementation in the embodiments of the disclosure, and does not constitute a limitation of the disclosure. The base plate connection bump may also be a structure with other shapes. The number, spacing, and location of the base plate connection bumps are not limited to any specific arrangement, and various modifications may be made.

In an embodiment, the first chip stack body 21 and the second chip stack body 22 are disposed on the base plate 10 by means of a bonding layer 60.

Chips in the first chip stack body 21 and chips in the second chip stack body 22 may be Dynamic Random Access Memory (DRAM) chips, Static Random Access Memory (SRAM) chips, flash memory chips, Electrically Erasable Programmable Read-Only Memory (EEPROM) chips, Phase-change Random Access Memory (PRAM) chips, Magnetic Random Access Memory (MRAM) chips, or Resistive Random Access Memory (RRAM) chips.

The bonding layer 60 may be a DAF film.

Figure 5:
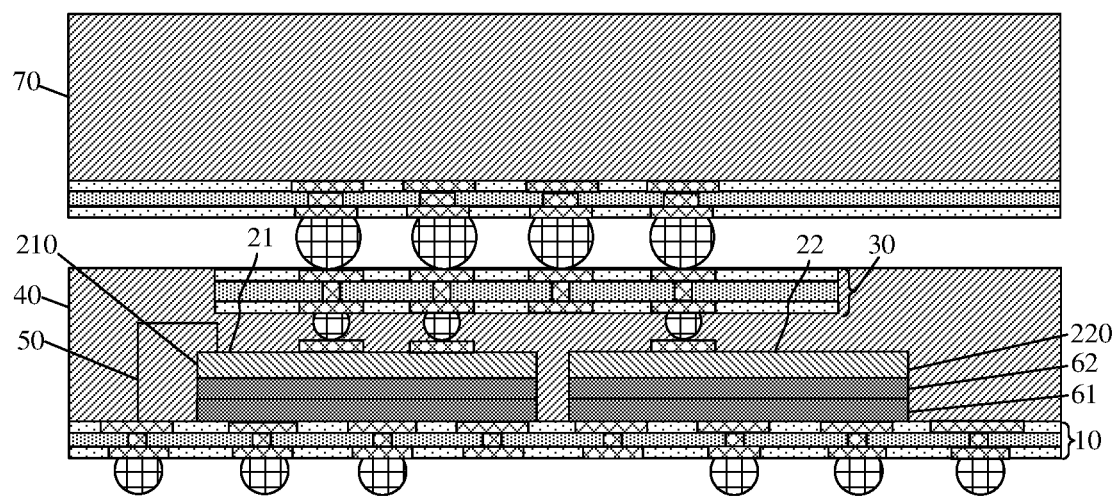

In an embodiment, as shown in FIG. 5, the bonding layer includes a first bonding layer 61 and a second bonding layer 62 located on the first bonding layer 61. An elastic modulus of the second bonding layer 62 is greater than an elastic modulus of the first bonding layer 61.

In this embodiment of the disclosure, since the first bonding layer is connected to the base plate, the first bonding layer mainly achieves a bonding effect. Since the second bonding layer is connected to the chips, the second bonding layer mainly achieves an effect of preventing the chip from warping. Since the elastic modulus of the second bonding layer is relatively high, warping does not occur during cutting. The first bonding layer has the relatively low elastic modulus, the bonding between the base plate and the chips will not be affected during the subsequent processes. The base plate 10 further includes a virtual channel 18. The bonding layer 60 is located on the virtual channel 18. A heat conductivity coefficient of the virtual channel 18 is greater than a heat conductivity coefficient of the bonding layer 60.

In this embodiment of the disclosure, since the heat conductivity coefficient of the virtual channel is greater than the heat conductivity coefficient of the bonding layer, more heat generated by the operation of the chips can be dissipated by means of the virtual channel. Therefore, a heat dissipation capacity can be enhanced, and the impact on the performance of the device can be reduced.

The virtual channel 18 is composed of the base plate upper connection pad 14, the base plate lower connection pad 15 and the base plate connection via 16. However, the base plate connection bump 17 is not formed below the virtual channel 18, so that signal transmission cannot be achieved, and only heat dissipation is performed.

In some embodiments, the heat conductivity coefficient of the virtual channel is greater than heat conductivity coefficients of other structures each composed of the base plate upper connection pad 14, the base plate lower connection pad 15 and the base plate connection via 16 for signal transmission, so that the impact of heat on signal transmission can be reduced.

As shown in FIG. 1, the first chip stack body 21 includes a first chip 210. The second chip stack body 22 includes a second chip 220. The first chip 210 is electrically connected to the second chip 220 by means of the intermediary layer 30.

In an embodiment, the first chip 210 or the second chip 220 is connected to the base plate 10 by means of a lead wire 50.

In the embodiment shown in FIG. 1, the first chip 210 is connected to the second chip 220 by means of the intermediary layer 30, and the first chip 210 is connected to the base plate 10 by means of the lead wire 50, so that the second chip 220 is connected to the base plate 10 indirectly. In other embodiments, the second chip is connected to the base plate by means of a lead wire, so that the first chip is connected to the base plate indirectly.

In this embodiment, since signal transmission between the first chip and the second chip is achieved by means of the intermediary layer, wire bonding may be performed only on one of the first chip and the second chip, so that the wire bonding process can be simplified.

Figure 2:
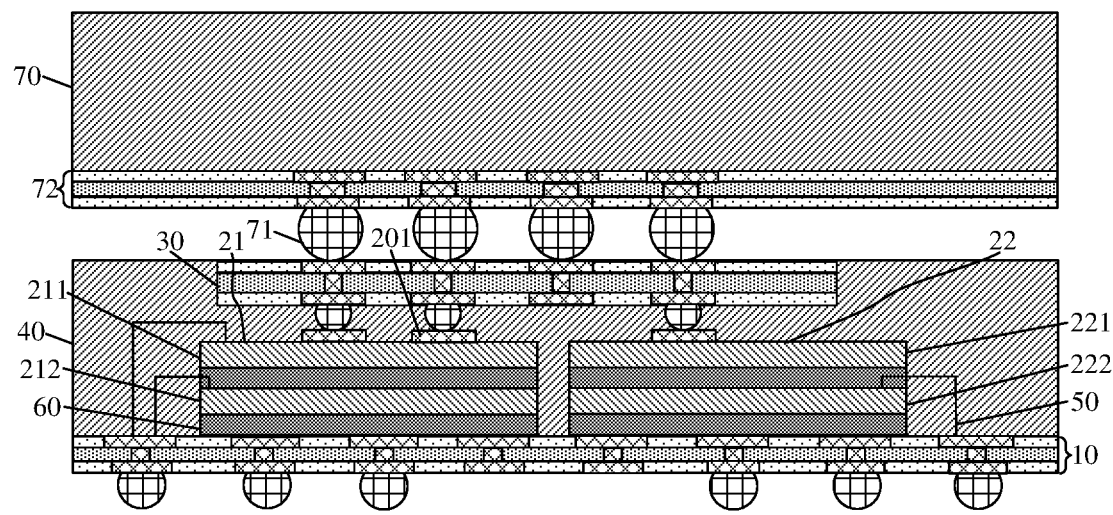
FIG. 2 to FIG. 5 are other examples of a semiconductor package structure according to an embodiment of the disclosure.
Figure 3:
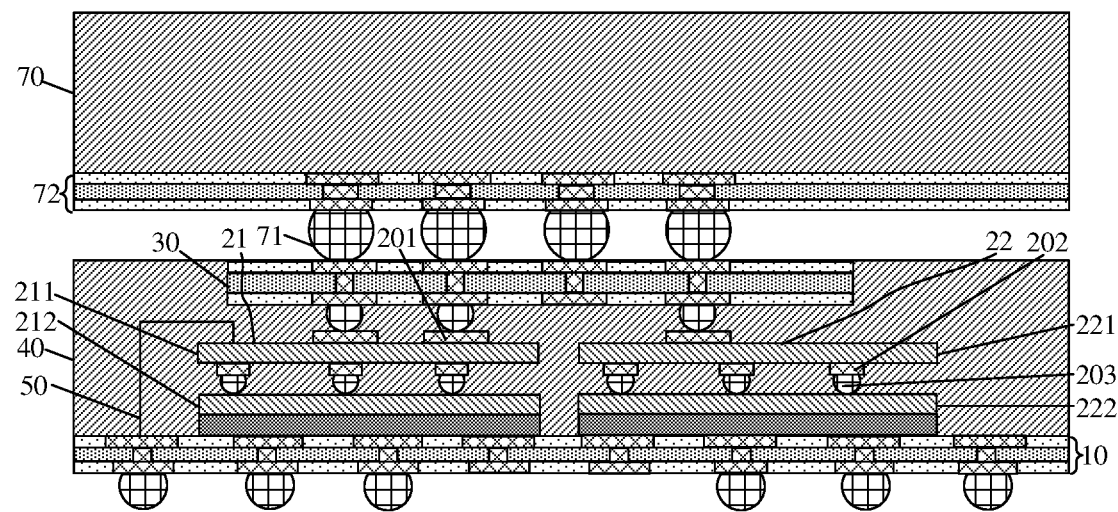

FIG. 2 is a schematic diagram of a semiconductor package structure according to another embodiment of the disclosure. FIG. 3 is a schematic diagram of a semiconductor package structure according to still another embodiment of the disclosure. As shown in FIG. 2 and FIG. 3, the first chip stack body 21 includes a first lower chip 212 and a first upper chip 211 that are stacked onto one another. The second chip stack body 22 includes a second lower chip 222 and a second upper chip 221 that are stacked onto one another.

The intermediary layer 30 is disposed on the first upper chip 211 and the second upper chip 221. The first upper chip 211 is electrically connected to the second upper chip 221 by means of the intermediary layer 30.

In an embodiment, as shown in FIG. 2, the first upper chip 211 or the second upper chip 221 is connected to the base plate 10 by means of the lead wire 50.

Each of the first lower chip 212 and the second lower chip 222 is connected to the base plate 10 by means of a lead wire 50 respectively.

In the embodiment shown in FIG. 2, the first upper chip 211 is connected to the second upper chip 221 by means of the intermediary layer 30, and the first upper chip 211 is connected to the base plate 10 by means of the lead wire 50, so that the second upper chip 221 is connected to the base plate 10 indirectly. In other embodiments, the second upper chip is connected to the base plate by means of the lead wire, so that the first upper chip is connected to the base plate indirectly.

In this embodiment, since signal transmission between the first upper chip and the second upper chip is achieved by means of the intermediary layer, wire bonding may be performed only on one of the first upper chip and the second upper chip, so that the wire bonding process can be simplified. In addition, since the first lower chip is isolated from the first upper chip and the second lower chip is isolated from the second upper chip by means of the bonding layer, signal transmission cannot be achieved, so that the first lower chip and the second lower chip are respectively connected to the base plate by means of wire bonding, so as to achieve signal transmission.

In an embodiment, as shown in FIG. 3, the first lower chip 212 is electrically connected to the first upper chip 211; and the second lower chip 222 is electrically connected to the second upper chip 221.

Specifically, the first lower chip 212 and the first upper chip 211 are connected with each other and the second lower chip 222 and the second upper chip 221 are connected with each other by means of a chip connection pad 202, a chip connection solder ball 203, and TSVs (not shown) located in the first upper chip 211 and the second upper chip 221.

In this embodiment, signal transmission may be directly performed between the first lower chip and the first upper chip, and signal transmission may be directly performed between the second lower chip and the second upper chip. In addition, signal transmission may also be performed between the first upper chip and the second upper chip by means of the intermediary layer. Therefore, wire bonding may be performed on the four chips for only once, thereby reducing the wire bonding process and reducing cost.

In an embodiment, the intermediary layer 30 includes: a first surface, where the plurality of first connection pads 31 are disposed on the first surface; a second surface, disposed opposite to the first surface, where a plurality of second connection pads 32 are disposed on the second surface; and a plurality of signal channels 33, configured to connect the plurality of first connection pads 31 and the plurality of second connection pads 32 with each other.

Each of the material of the plurality of first connection pads 31 and the material of the plurality of second connection pads 32 may include at least one of aluminum, copper, nickel, tungsten, platinum, or gold.

The intermediary layer 30 includes an intermediary substrate 302, an intermediary upper insulating dielectric layer 301 located on an upper surface of the intermediary substrate 302, and an intermediary lower insulating dielectric layer 303 located on a lower surface of the intermediary substrate 302. The plurality of first connection pads 31 are located in the intermediary upper insulating dielectric layer 301, and the plurality of second connection pads 32 are located in the intermediary lower insulating dielectric layer 303.

The intermediary substrate may be a silicon substrate, a germanium substrate, a silicon germanium substrate, a silicon carbide substrate, an Silicon On Insulator (SOI) substrate, or a Germanium On Insulator (GOI) substrate, or may be a substrate including other element semiconductors or compound semiconductors, such as a glass substrate or a III-V compound substrates (for example, a gallium nitride substrate or a gallium arsenide substrate), or may be a stack of layer structures such as Si/SiGe, or may be other epitaxial structures such as Silicon Germanium On Insulator (SGOI).

Each of the intermediary upper insulating dielectric layer 301 and the intermediary lower insulating dielectric layer 303 may be a solder mask layer. For example, each of the material of the intermediary upper insulating dielectric layer and the material of the intermediary lower insulating dielectric layer may be green paint.

In an embodiment, the first chip stack body 21 and the second chip stack body 22 include a plurality of lead wire pads 201. The plurality of lead wire pads 201 are connected to the plurality of second connection pads 32 by means of a re-distribution layer.

In this embodiment, the re-distribution layer (not shown) may be located on a surface of the first chip stack body and a surface of the second chip stack body, or may be located inside the first chip stack body and the second chip stack body.

As shown in FIG. 1, a plurality of first solder balls 34 are formed between the plurality of second connection pads 32 and the plurality of lead wire pads 201. The plurality of lead wire pads 201 on the first chip stack body 21 and the second chip stack body 22 are connected to the plurality of second connection pads 32 by means of the plurality of first solder balls 34.

In an embodiment, the plurality of second connection pads 32 connected to the first chip stack body 21 and the second chip stack body 22 are connected to each other by means of a re-distribution layer.

In this embodiment, the re-distribution layer may be located on a surface of the intermediary layer, or may be located inside the intermediary layer.

In an embodiment, the molding compound 40 is coplanar with the plurality of first connection pads 31. In this way, after the second package structure is connected to the first package structure, there may be a large gap between the first package structure and the second package structure, so that the heat dissipation efficiency of the second package structure can be guaranteed.

If a surface of the molding compound is higher than a surface of each of the plurality of first connection pads, the gap between the first package structure and the second package structure is reduced, which does not facilitate heat dissipation and the filling of a filling layer when the filling layer is formed subsequently. If the surface of each of the plurality of first connection pads is higher than the surface of the molding compound, the gap may be increased, but the molding compound may not cover a bonding wire, so that the bonding wire is exposed, which does not facilitate the protection of the bonding wire.

In an embodiment, the second package structure 70 includes a second solder ball 71. The second solder ball 71 is electrically connected to the plurality of first connection pads 31 located on the intermediary layer 30.

The second package structure 70 may be a Universal File Store (UFS) chip.

The second package structure 70 further includes a second base plate 72. The structure of the second base plate 72 may be the same as the structure of the base plate 10, which is not described herein again.

The second solder ball 71 is located on the second base plate 72.

Figure 4:
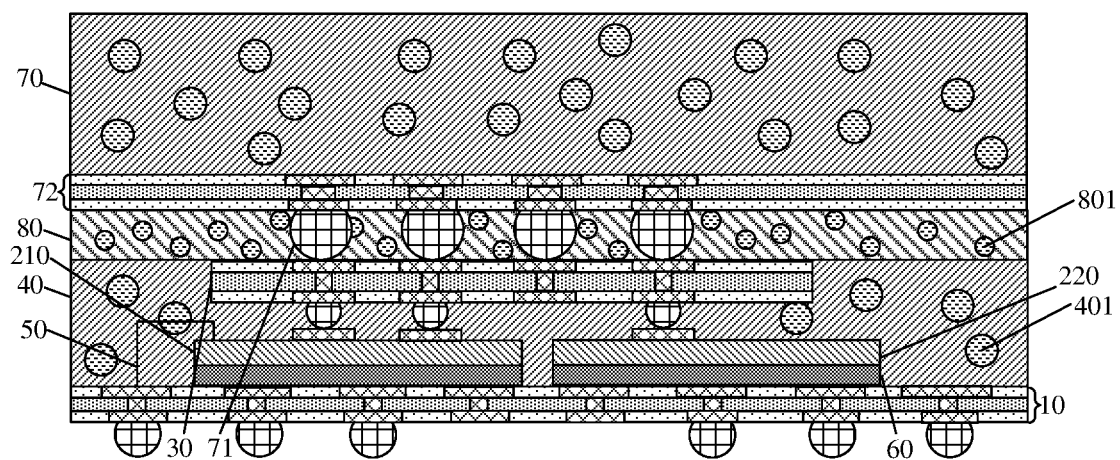

FIG. 4 is a schematic diagram of a semiconductor package structure according to another embodiment of the disclosure. As shown in FIG. 4, the semiconductor package structure further includes a filling layer 80. The gap is fully filled with the filling layer 80.

A heat conductivity coefficient of the filling layer 80 is greater than a heat conductivity coefficient of the molding compound 40.

Through the arrangement of the filling layer, a sealed interface may be formed between the first package structure and the second package structure, so as to reduce the contact of metal structures of the first package structure and the second package structure with external air or other materials, and heat conduction can be achieved as well. Since the heat conductivity coefficient of the filling layer is relatively large, more heat can be dissipated from the filling layer, so that the impact of the heat on the first package structure can be reduced. Although the heat conductivity coefficient of the filling layer is relatively large, since a thermal expansion coefficient of the filling layer matches with a thermal expansion coefficient of the first package structure and a thermal expansion coefficient of the second package structure, the change in the volume of the filling layer is small. Therefore, no outward pressure is generated on the first package structure and the second package structure, and the stability of the structure can be guaranteed.

In some embodiments, for example, the filling layer 80 is filled with a carbon nanotube filler, so that more heat can be absorbed from the second package structure. Therefore, the impact of the heat on the first package structure can be reduced.

The volume of a filler in the filling layer 80 is less than the volume of a filler in the molding compound 40.

As shown in FIG. 4, the filler in the molding compound 40 is a first filler 401, and the filler in the filling layer 80 is a second filler 801. The volume of the second filler 801 is less than the volume of the first filler 401.

Each of a main material of the molding compound 40 and a main material of the filling layer 80 may be epoxy resin, and each of the filler in the molding compound and the filler in the filling layer may be silicon dioxide.

In this embodiment, since the gap filled by the molding compound is relatively large, and the gap between the first package structure and the second package structure is relatively small, the filling layer with large fluidity is selected. The volume of the filler in the filling layer is small, and the fluidity of the main material of the filling layer is large.

The semiconductor package structure provided in the embodiments of the disclosure is applicable to UFS Multi Chip Package (UMCP) of a Package on Package (PoP) structure.

Figure 6:
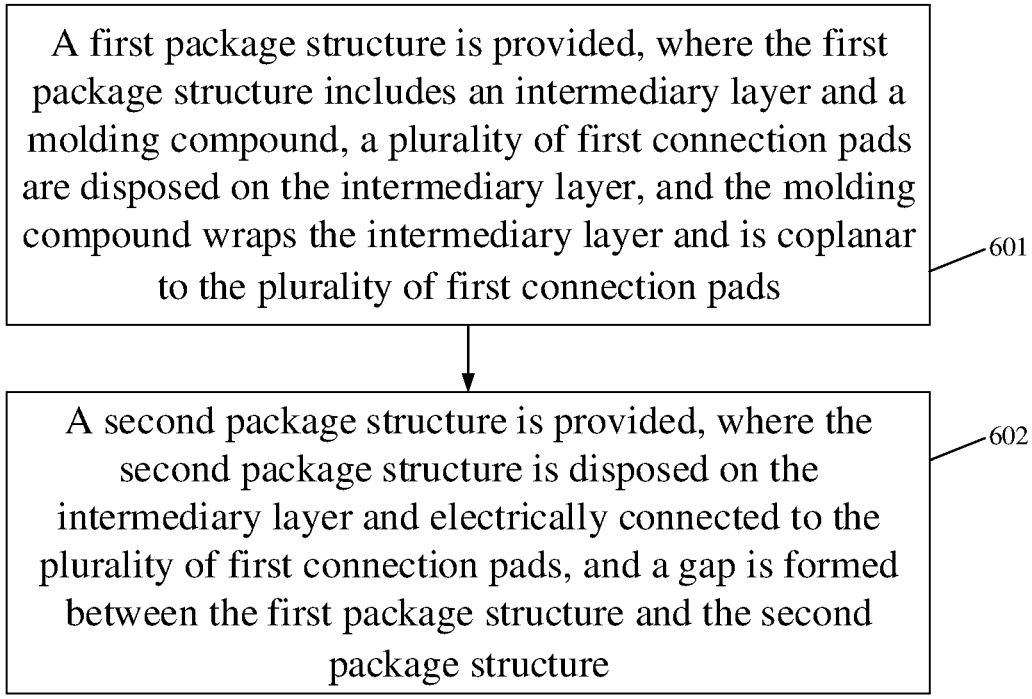
FIG. 6 is a schematic flowchart of a method for manufacturing a semiconductor package structure according to an embodiment of the disclosure.

An embodiment of the disclosure further provides a method for manufacturing a semiconductor package structure. With reference to FIG. 6 for details, as shown in the figure, the method includes the following operations.

At S601, a first package structure is provided, where the first package structure includes an intermediary layer and a molding compound, a plurality of first connection pads are disposed on the intermediary layer, and the molding compound wraps the intermediary layer and is coplanar to the plurality of first connection pads.

At S602, a second package structure is provided, where the second package structure is disposed on the intermediary layer and electrically connected to the plurality of first connection pads, and a gap is formed between the first package structure and the second package structure.

The method for manufacturing the semiconductor package structure provided in the embodiments of the disclosure is further described in detail below with reference to specific embodiments.

FIG. 7A to FIG. 7G are schematic diagrams of a semiconductor package structure during manufacturing according to an embodiment of the disclosure.

First, with reference to FIG. 7A to FIG. 7E, S601 is executed, where the first package structure is provided. The first package structure includes an intermediary layer 30 and a molding compound 40. A plurality of first connection pads 31 are disposed on the intermediary layer 30. The molding compound 40 wraps the intermediary layer 30 and is coplanar to the plurality of first connection pads 31.

Figure 7A:
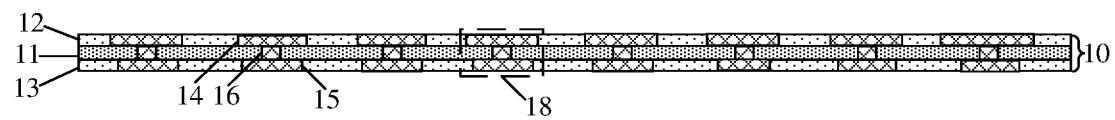
FIG. 7A to FIG. 7G are schematic diagrams of a device structure of a semiconductor package structure during manufacturing according to an embodiment of the disclosure.

Specifically, with reference to FIG. 7A first, the base plate 10 is provided.

In some embodiments, the base plate 10 may be a redistribution base plate.

The base plate 10 includes a base plate substrate 11, a base plate upper insulating dielectric layer 12 disposed on an upper surface of the base plate substrate 11, and a base plate lower insulating dielectric layer 13 disposed on a lower surface of the base plate substrate 11.

The base plate substrate 11 may be a silicon substrate, a germanium substrate, a silicon germanium substrate, a silicon carbide substrate, an Silicon On Insulator (SOI) substrate, or a Germanium On Insulator (GOI) substrate, or may be a substrate including other element semiconductors or compound semiconductors, such as a glass substrate or a III-V compound substrates (for example, a gallium nitride substrate or a gallium arsenide substrate), or may be a stack of layer structures such as Si/SiGe, or may be other epitaxial structures such as Silicon Germanium On Insulator (SGOI).

Each of the base plate upper insulating dielectric layer 12 and the base plate lower insulating dielectric layer 13 may be a solder mask layer. For example, each of the material of the base plate upper insulating dielectric layer 12 and the material of the base plate lower insulating dielectric layer 13 may be green paint.

The base plate 10 further includes a base plate upper connection pad 14 located in the base plate upper insulating dielectric layer 12, a base plate lower connection pad 15 located in the base plate lower insulating dielectric layer 13, and a base plate connection via 16 which penetrates through the base plate substrate 11 and which connects the base plate upper connection pad 14 and the base plate lower connection pad 15 with each other.

Each of the material of the base plate upper connection pad 14 and the material of the base plate lower connection pad 15 may include at least one of aluminum, copper, nickel, tungsten, platinum, or gold. The base plate connection via 16 may be a TSV.

The base plate upper connection pad 14 is connected to the base plate lower connection pad 15 by means of the base plate connection via 16, so that a signal can be transmitted. In addition, two adjacent base plate upper connection pads 14 may also be connected with each other by means of a re-distribution layer, so that the transmission of the signal on the base plate can be completed.

The base plate 10 further includes a virtual channel 18. The virtual channel 18 is composed of the base plate upper connection pad 14, the base plate lower connection pad 15 and the base plate connection via 16. However, the base plate connection bump is not formed below the virtual channel 18, so that signal transmission cannot be achieved, and only heat dissipation is performed.

In some embodiments, the heat conductivity coefficient of the virtual channel is greater than heat conductivity coefficients of other structures each composed of the base plate upper connection pad 14, the base plate lower connection pad 15 and the base plate connection via 16 for signal transmission, so that the impact of heat on signal transmission can be reduced.

Figure 7B:
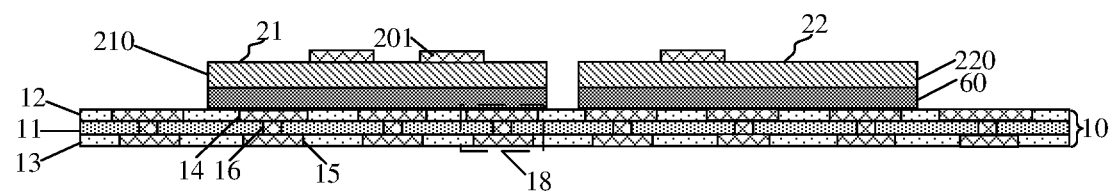

Next, with reference to FIG. 7B, at least one first chip stack body 21 and at least one second chip stack body 22 are formed on the base plate 10. The first chip stack body 21 is spaced apart from the second chip stack body 22.

Specifically, a bonding layer 60 is first formed on the base plate 10, and then the first chip stack body 21 and the second chip stack body 22 are formed on the bonding layer 60.

The bonding layer 60 may be a DAF film.

In an embodiment, as shown in FIG. 5, the bonding layer 60 includes a first bonding layer 61 and a second bonding layer 62 located on the first bonding layer 61. An elastic modulus of the second bonding layer 62 is greater than an elastic modulus of the first bonding layer 61.

In this embodiment of the disclosure, since the first bonding layer is connected to the base plate, the first bonding layer mainly achieves a bonding effect. Since the second bonding layer is connected to the chips, the second bonding layer mainly achieves an effect of preventing the chip from warping. Since the elastic modulus of the second bonding layer is relatively high, warping does not occur during cutting. The first bonding layer has the relatively low elastic modulus, the bonding between the base plate and the chips will not be affected during the subsequent processes.

In an embodiment, the bonding layer 60 is located on the virtual channel 18. A heat conductivity coefficient of the virtual channel 18 is greater than a heat conductivity coefficient of the bonding layer 60.

In this embodiment of the disclosure, since the heat conductivity coefficient of the virtual channel is greater than the heat conductivity coefficient of the bonding layer, more heat generated by the operation of the chips can be dissipated by means of the virtual channel. Therefore, a heat dissipation capacity can be enhanced, and the impact on the performance of the device can be reduced.

Continuously with reference to FIG. 7B, a plurality of lead wire pads 201 are formed on the first chip stack body 21 and the second chip stack body 22. The plurality of lead wire pads 201 may be connected to a plurality of second connection pads located on a subsequently formed intermediary layer by means of a re-distribution layer.

Figure 7C:
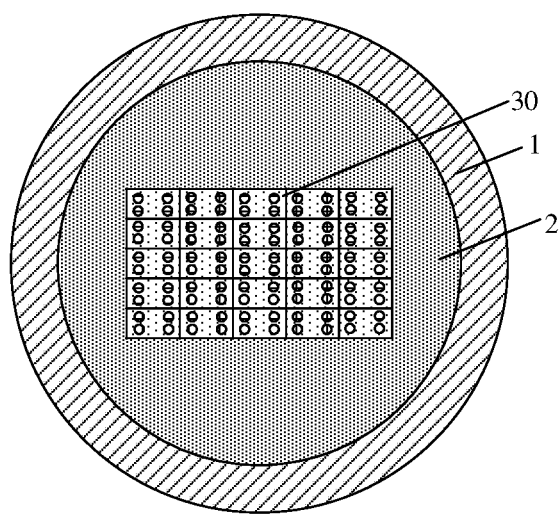
Figure 7D:
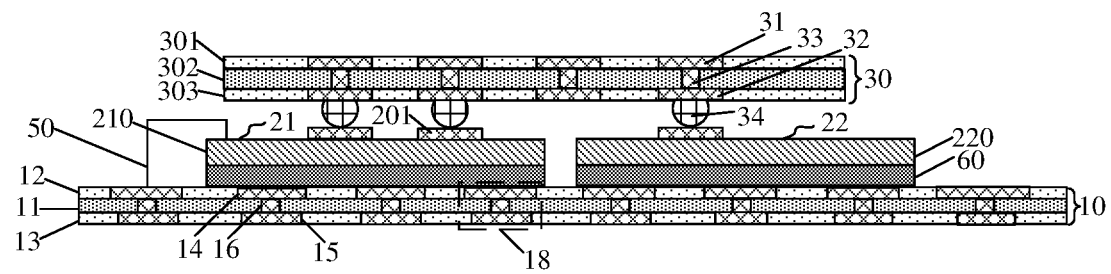

Next, with reference to FIG. 7C and FIG. 7D, an intermediary layer 30 is formed on the first chip stack body 21 and the second chip stack body 22.

Specifically, with reference to FIG. 7C first, a carrier band 2 is pasted on a circular ring 1. The intermediary layer is then pasted on the carrier band 2. In this case, the entire intermediary layer is in a whole strip shape. The intermediary layer is cut to form units one by one shown in FIG. 7C.

During an actual operation, a surface of the intermediary layer on which the intermediary upper insulating dielectric layer is formed is pasted on the carrier band, and a plurality of first solder balls are formed on a surface of the intermediary layer on which the intermediary lower insulating dielectric layer is formed.

Next, with reference to FIG. 7D, the intermediary layer 30 is disposed on the first chip stack body 21 and the second chip stack body 22 in an inverted manner, so that the plurality of first solder balls 34 are connected to the first chip stack body 21 and the second chip stack body 22.

In this embodiment of the disclosure, by connecting the first chip stack body and the second chip stack body with each other by means of the intermediary layer, the number of wire bonding can be decreased, and a wire bonding process can be simplified.

The intermediary layer 30 includes: a first surface, where the plurality of first connection pads 31 are disposed on the first surface; a second surface, disposed opposite to the first surface, where the plurality of second connection pads 32 are disposed on the second surface; and a plurality of signal channels 33, configured to connect the plurality of first connection pads 31 and the plurality of second connection pads 32 with each other.

Each of the material of the plurality of first connection pads 31 and the material of the plurality of second connection pads 32 may include at least one of aluminum, copper, nickel, tungsten, platinum, or gold.

The intermediary layer 30 further includes an intermediary substrate 302, an intermediary upper insulating dielectric layer 301 located on an upper surface of the intermediary substrate 302, and an intermediary lower insulating dielectric layer 303 located on a lower surface of the intermediary substrate 302. The plurality of first connection pads 31 are located in the intermediary upper insulating dielectric layer 301, and the plurality of second connection pads 32 are located in the intermediary lower insulating dielectric layer 303.

As shown in FIG. 7D, the first chip stack body includes one first chip 210. The second chip stack body 22 includes one second chip 220. The first chip 210 is electrically connected to the second chip 220 by means of the intermediary layer 30.

Next, the first chip 210 or the second chip 220 is connected to the base plate 10 by means of a lead wire 50.

In the embodiment shown in FIG. 7D, the first chip 210 is connected to the second chip 220 by means of the intermediary layer 30, and the first chip 210 is connected to the base plate 10 by means of the lead wire 50, so that the second chip 220 is connected to the base plate 10 indirectly. In other embodiments, the second chip is connected to the base plate by means of the lead wire, so that the first chip is connected to the base plate indirectly. In this embodiment, since signal transmission between the first chip and the second chip is achieved by means of the intermediary layer, wire bonding may be performed only on one of the first chip and the second chip, so that the wire bonding process can be simplified.

It is to be noted that, embodiments shown in FIG. 7A to FIG. 7G only show the method for manufacturing a semiconductor package structure in which the first chip stack body includes one first chip, and the second chip stack body includes one second chip, but each of the first chip stack body and the second chip stack body may also include other stack structures.

For example, as shown in FIG. 2 and FIG. 3, the first chip stack body 21 includes a first lower chip 212 and a first upper chip 211 that are stacked onto one another. The second chip stack body 22 includes a second lower chip 222 and a second upper chip 221 that are stacked onto one another. The intermediary layer 30 is disposed on the first upper chip 211 and the second upper chip 221. The first upper chip 211 is electrically connected to the second upper chip 221 by means of the intermediary layer 30.

As shown in FIG. 2, the first upper chip 211 or the second upper chip 221 is connected to the base plate 10 by means of the lead wire 50.

Each of the first lower chip 212 and the second lower chip 222 is connected to the base plate 10 by means of a lead wire 50 respectively.

In the embodiment shown in FIG. 2, the first upper chip 211 is connected to the second upper chip 221 by means of the intermediary layer 30, and the first upper chip 211 is connected to the base plate 10 by means of the lead wire 50, so that the second upper chip 221 is connected to the base plate 10 indirectly. In other embodiments, the second upper chip is connected to the base plate by means of the lead wire, so that the first upper chip is connected to the base plate indirectly.

In this embodiment, since signal transmission between the first upper chip and the second upper chip is achieved by means of the intermediary layer, wire bonding may be performed only on one of the first upper chip and the second upper chip, so that the wire bonding process can be simplified. In addition, since the first lower chip is isolated from the first upper chip and the second lower chip is isolated from the second upper chip by means of the bonding layer, signal transmission cannot be achieved, so that the first lower chip and the second lower chip are respectively connected to the base plate by means of wire bonding, so as to achieve signal transmission.

As shown in FIG. 3, the first lower chip 212 is electrically connected to the first upper chip 211; and the second lower chip 222 is electrically connected to the second upper chip 221.

Specifically, the first lower chip 212 and the first upper chip 211 are connected with each other and the second lower chip 222 and the second upper chip 221 are connected with each other by means of a chip connection pad 202, a chip connection solder ball 203, and TSVs (not shown) located in the first upper chip 211 and the second upper chip 221.

In this embodiment, signal transmission may be directly performed between the first lower chip and the first upper chip, and signal transmission may be directly performed between the second lower chip and the second upper chip. In addition, signal transmission may also be performed between the first upper chip and the second upper chip by means of the intermediary layer. Therefore, wire bonding may be performed on the four chips for only once, thereby reducing the wire bonding process and reducing cost.

Continuously with reference to FIG. 7D, the plurality of second connection pads 32 connected to the first chip stack body 21 and the second chip stack body 22 are connected to each other by means of a re-distribution layer.

In this embodiment, the re-distribution layer may be located on a surface of the intermediary layer, or may be located inside the intermediary layer.

Figure 7E:
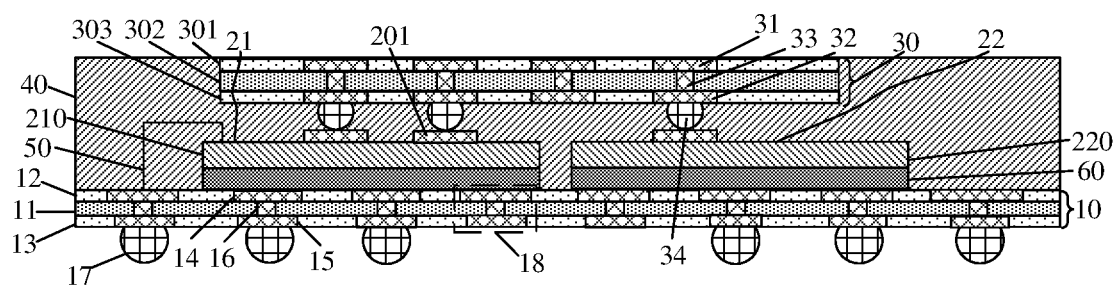

Next, with reference to FIG. 7E, a molding compound 40 wrapping the first chip stack body 21, the second chip stack body 22 and the intermediary layer 30 is formed.

In the embodiments of the disclosure, since the finally formed molding compound is coplanar to the plurality of first connection pads of the intermediary layer, during the formation of the molding compound, a profiled mold is not required, but only a mold with a normal shape is required. Since the mold with the normal shape is simple in shape, a manufacturing process is simple, and cost is relatively low.

In addition, after the second package structure is connected to the first package structure subsequently, there may be a large gap between the first package structure and the second package structure, so that the heat dissipation efficiency of the second package structure can be guaranteed.

If a surface of the molding compound is higher than a surface of each of the plurality of first connection pads, the gap between the first package structure and the second package structure is reduced, which does not facilitate heat dissipation and the filling of a filling layer when the filling layer is formed subsequently. If the surface of each of the plurality of first connection pads is higher than the surface of the molding compound, the gap may be increased, but the molding compound may not cover a bonding wire, so that the bonding wire is exposed, which does not facilitate the protection of the bonding wire.

Continuously with reference to FIG. 7E, after the molding compound 40 is formed, a base plate connection bump 17 is formed on the base plate lower connection pad 15 of the base plate 10. The base plate connection bump 17 includes a conductive material.

Figure 7F:
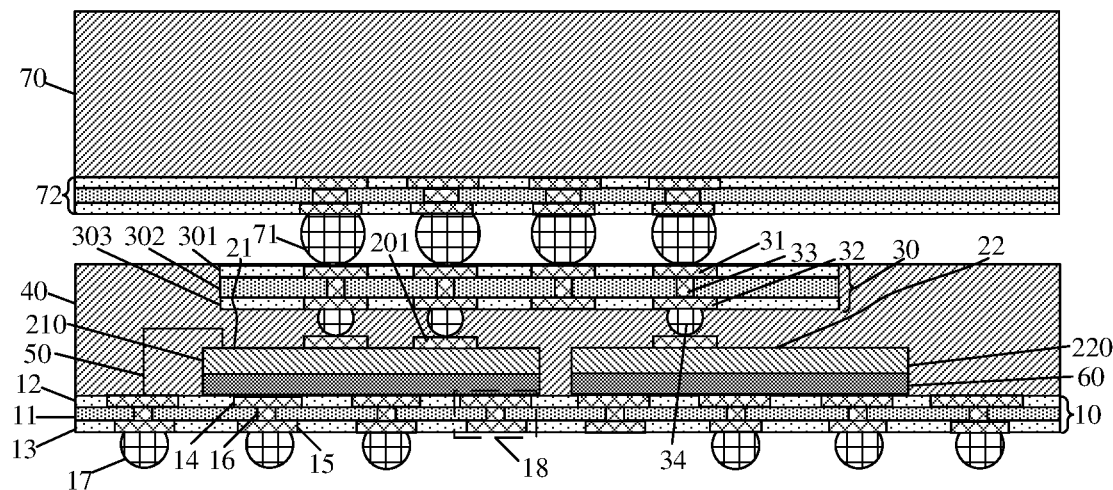

Next, with reference to FIG. 7F, S602 is executed, where the second package structure 70 is provided. The second package structure 70 is disposed on the intermediary layer 30 and electrically connected to the plurality of first connection pads 31. A gap is formed between the first package structure and the second package structure 70.

Specifically, a second solder ball 71 is formed on the second package structure 70. The second solder ball 71 is electrically connected to the plurality of first connection pads 31 located on the intermediary layer 30.

The second package structure further includes a second base plate 72. The structure of the second base plate 72 may be the same as the structure of the base plate 10, which is not described herein again.

The second solder ball 71 is located on the second base plate 72.

Figure 7G:
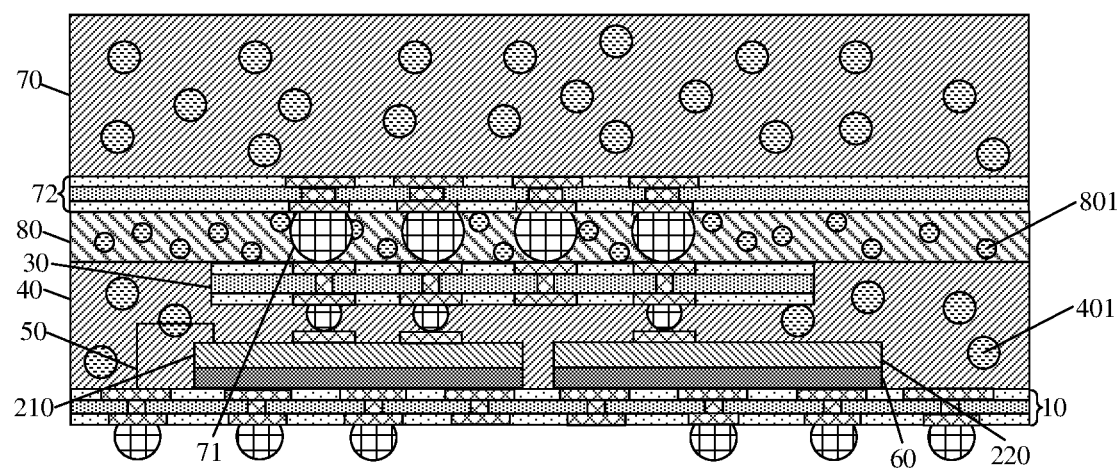

Next, with reference to FIG. 7G, a filling layer 80 is formed in the gap between the first package structure and the second package structure 70.

A heat conductivity coefficient of the filling layer 80 is greater than a heat conductivity coefficient of the molding compound 40.

Through the arrangement of the filling layer, a sealed interface may be formed between the first package structure and the second package structure, so as to reduce the contact of metal structures of the first package structure and the second package structure with external air or other materials, and heat conduction can be achieved as well. Since the heat conductivity coefficient of the filling layer is relatively large, more heat can be dissipated from the filling layer, so that the impact of the heat on the first package structure can be reduced. In addition, since a thermal expansion coefficient of the filling layer matches with a thermal expansion coefficient of the first package structure and a thermal expansion coefficient of the second package structure, the change in the volume of the filling layer is small. Therefore, no outward pressure is generated on the first package structure and the second package structure, and the stability of the structure can be guaranteed.

The volume of a filler in the filling layer 80 is less than the volume of a filler in the molding compound 40.

As shown in FIG. 7G, the filler in the molding compound 40 is a first filler 401, and the filler in the filling layer 80 is a second filler 801. The volume of the second filler 801 is less than the volume of the first filler 401.

Each of a main material of the molding compound 40 and a main material of the filling layer 80 may be epoxy resin, and each of the filler in the molding compound and the filler in the filling layer may be silicon dioxide.

In this embodiment, since the gap filled by the molding compound is relatively large, and the gap between the first package structure and the second package structure is relatively small, the filling layer with large fluidity is selected. The volume of the filler in the filling layer is small, and the fluidity of the main material of the filling layer is large.

In the embodiments of the disclosure, through the arrangement of the intermediary layer, the first package structure can be connected to the second package structure by means of the intermediary layer. In this way, the interconnection among package structures with different capacities can be achieved, so as to cause a combination among different package structures to be more flexible. Therefore, the semiconductor package structure is applicable to different application scenarios. In addition, since the first package structure and the second package structure are independently packaged, the first package structure and the second package structure may be respectively tested, so that failure analysis can be performed more rapidly. Therefore, after the semiconductor package structure is assembled, testing may not be required to be performed on the entire structure. Since there is a gap between the second package structure and the first package structure, the spacing between the second package structure and the first package structure can be increased. Therefore, the heat dissipation efficiency of the second package structure can be enhanced, and the impact of heat on chips can be reduced.

The above are only preferred embodiments of the disclosure, and are not used to limit the scope of protection of the disclosure. Any modifications, equivalent replacements and improvements and the like made within the spirit and principle of the disclosure shall be included within the scope of protection of the disclosure.

The invention claimed is:

1. A semiconductor package structure, comprising:
a first package structure, comprising an intermediary layer and a molding compound, wherein a plurality of first connection pads are disposed on the intermediary layer, and the molding compound wraps the intermediary layer and is coplanar to the plurality of first connection pads; and
a second package structure, disposed on the intermediary layer and electrically connected to the plurality of first connection pads,
wherein a gap is formed between the first package structure and the second package structure;
wherein the first package structure further comprises:
a base plate;
at least one first chip stack body, disposed on the base plate; and
at least one second chip stack body, disposed on the base plate and spaced apart from the first chip stack body,
wherein the intermediary layer is disposed on the first chip stack body and the second chip stack body:
wherein the first chip stack body comprises one first chip, and the second chip stack body comprises one second chip; and
wherein the first chip is electrically connected to the second chip by means of the intermediary layer.

2. The semiconductor package structure of claim 1, wherein the first chip or the second chip is connected to the base plate by means of a lead wire.

3. The semiconductor package structure of claim 1, wherein the first chip stack body comprises a first lower chip and a first upper chip that are stacked onto one another, and the second chip stack body comprises a second lower chip and a second upper chip that are stacked onto one another; and
wherein the intermediary layer is disposed on the first upper chip and the second upper chip, and the first upper chip is electrically connected to the second upper chip by means of the intermediary layer.

4. The semiconductor package structure of claim 3, wherein the first upper chip or the second upper chip is connected to the base plate by means of a lead wire.

5. The semiconductor package structure of claim 4, wherein each of the first lower chip and the second lower chip is connected to the base plate by means of a lead wire respectively.

6. The semiconductor package structure of claim 4, wherein the first lower chip is electrically connected to the first upper chip, and the second lower chip is electrically connected to the second upper chip.

7. The semiconductor package structure of claim 1, wherein the intermediary layer comprises:
a first surface, wherein the plurality of first connection pads are disposed on the first surface;
a second surface, disposed opposite to the first surface, wherein a plurality of second connection pads are disposed on the second surface; and
a plurality of signal channels, configured to connect the plurality of first connection pads and the plurality of second connection pads with each other.

8. The semiconductor package structure of claim 7, wherein a first chip stack body and a second chip stack body comprise a plurality of lead wire pads, and the plurality of lead wire pads are connected to the plurality of second connection pads by means of a re-distribution layer.

9. The semiconductor package structure of claim 7, wherein the plurality of second connection pads connected to a first chip stack body and a second chip stack body are connected to each other by means of a re-distribution layer.

10. The semiconductor package structure of claim 1, wherein the first chip stack body and the second chip stack body are disposed on the base plate by means of a bonding layer.

11. The semiconductor package structure of claim 10, wherein the base plate comprises a virtual channel, the bonding layer is located on the virtual channel, and a heat conductivity coefficient of the virtual channel is greater than a heat conductivity coefficient of the bonding layer.

12. The semiconductor package structure of claim 10, wherein the bonding layer comprises a first bonding layer and a second bonding layer, the second bonding layer is located on the first bonding layer, and an elastic modulus of the second bonding layer is greater than an elastic modulus of the first bonding layer.

13. The semiconductor package structure of claim 1, further comprising a filling layer, wherein the gap is fully filled with the filling layer.

14. The semiconductor package structure of claim 13, wherein a heat conductivity coefficient of the filling layer is greater than a heat conductivity coefficient of the molding compound.

15. The semiconductor package structure of claim 13, wherein a volume of a filler in the filling layer is less than a volume of a filler in the molding compound.

16. A semiconductor package structure, comprising:
a first package structure, comprising an intermediary layer and a molding compound, wherein a plurality of first connection pads are disposed on the intermediary layer, and the molding compound wraps the intermediary layer and is coplanar to the plurality of first connection pads; and
a second package structure, disposed on the intermediary layer and electrically connected to the plurality of first connection pads,
wherein a gap is formed between the first package structure and the second package structure;
wherein the first package structure further comprises:
a base plate;
at least one first chip stack body, disposed on the base plate; and
at least one second chip stack body, disposed on the base plate and spaced apart from the first chip stack body,
wherein the intermediary layer is disposed on the first chip stack body and the second chip stack body,
wherein the first chip stack body comprises a first lower chip and a first upper chip that are stacked onto one another, and the second chip stack body comprises a second lower chip and a second upper chip that are stacked onto one another; and
wherein the intermediary layer is disposed on the first upper chip and the second upper chip, and the first upper chip is electrically connected to the second upper chip by means of the intermediary layer.

17. The semiconductor package structure of claim 16, wherein the first upper chip or the second upper chip is connected to the base plate by means of a lead wire; wherein each of the first lower chip and the second lower chip is connected to the base plate by means of a lead wire respectively.

18. A semiconductor package structure, comprising:
a first package structure, comprising an intermediary layer and a molding compound, wherein a plurality of first connection pads are disposed on the intermediary layer, and the molding compound wraps the intermediary layer and is coplanar to the plurality of first connection pads; and
a second package structure, disposed on the intermediary layer and electrically connected to the plurality of first connection pads,
wherein a gap is formed between the first package structure and the second package structure;
wherein the first package structure further comprises:
a base plate;
at least one first chip stack body, disposed on the base plate; and
at least one second chip stack body, disposed on the base plate and spaced apart from the first chip stack body,
wherein the intermediary layer is disposed on the first chip stack body and the second chip stack body;
wherein the first chip stack body and the second chip stack body are disposed on the base plate by means of a bonding layer;
wherein the base plate comprises a virtual channel, the bonding layer is located on the virtual channel, and a heat conductivity coefficient of the virtual channel is greater than a heat conductivity coefficient of the bonding layer.

19. The semiconductor package structure of claim 18, wherein the first chip stack body and the second chip stack body are disposed on the base plate by means of a bonding layer.

20. The semiconductor package structure of claim 19, wherein the bonding layer comprises a first bonding layer and a second bonding layer, the second bonding layer is located on the first bonding layer, and an elastic modulus of the second bonding layer is greater than an elastic modulus of the first bonding layer.

* * * * *